(12) United States Patent
Osaka et al.

(10) Patent No.: US 6,586,278 B1
(45) Date of Patent: Jul. 1, 2003

(54) METHOD FOR MOUNTING ELECTRONIC COMPONENT AND STRUCTURE HAVING MOUNTED THEREON AN ELECTRONIC COMPONENT

(75) Inventors: Takeshi Osaka, Shiga-ken (JP); Mototsugu Okamura, Kusatsu (JP); Masaaki Minami, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/483,193

(22) Filed: Jan. 14, 2000

(30) Foreign Application Priority Data

Jan. 19, 1999 (JP) ............................................ 11-010274
Jan. 11, 2000 (JP) ........................................ 2000-002713

(51) Int. Cl.⁷ ......................... H01L 21/44; H01L 21/48; H01L 21/50
(52) U.S. Cl. ........................ 438/120; 438/612; 438/613
(58) Field of Search ................................ 438/120, 106, 438/110, 612, 613, 692; 257/737, 738, 669

(56) References Cited

U.S. PATENT DOCUMENTS 5,926,694 A * 7/1999 Chigawa et al. ............ 438/106
5,934,996 A * 8/1999 Nagai et al.
6,323,542 B1 * 11/2001 Hashimoto

* cited by examiner

Primary Examiner—Olik Chaudhuri
Assistant Examiner—Hsien-Ming Lee
(74) Attorney, Agent, or Firm—Keating & Bennett, LLP

(57) ABSTRACT

A method for mounting an electronic component on a substrate is shown, which involves positioning an electronic component 1 on wiring electrodes 5 of a substrate 4 via bumps 3, application of ultrasonic oscillation to the electronic component 1 where the ultrasonic oscillation of the top portion of an ultrasonic-oscillation applying unit (a collet) 8 is larger than the oscillating amplitude of the electronic component 1. After heating the bumps 3 and an area in proximity thereto, the bumps 3 and the wiring electrodes 5 on the substrate 4 are metallically bonded, thereby mounting the electronic component 1 on the substrate 4 via the bumps 3.

24 Claims, 4 Drawing Sheets

METHOD FOR MOUNTING ELECTRONIC COMPONENT AND STRUCTURE HAVING MOUNTED THEREON AN ELECTRONIC COMPONENT

BACKGROUND

The present invention relates to a method for mounting electronic components and structures having mounted thereon electronic components, and more particularly, the invention relates to a method for mounting electronic components and structures having mounted thereon electronic components in which electrodes of the electronic components are mounted by connecting the electrodes to wiring electrodes of substrates via bumps.

FIG. 7 shows an example of a structure where an electronic component is mounted on a substrate (a substrate used for mounting) via bumps by a conventional method. In such a structure, the top portions of Au bumps (protruding bumps) 53 are on surfaces of electrodes 52. The bumps 53 disposed on electrodes 52 are formed on a surface of an electronic component 51. The bumps 53 are connected to wiring electrodes (substrate pads) 55 of a substrate 54 by a conductive adhesive (a conductive paste) 56. An insulating bonding resin 57 fills a gap between the electronic component 51 and the substrate 54, and mounts the electronic component 51 on the substrate 54.

In the above-described method for mounting the electronic component, the conductive adhesive 56 (the conductive paste) is applied at the top portions of the Au bumps (the protruding bumps) 53 formed on the electronic component 51 through wire bonding technology. The insulating bonding resin 57 is applied to the wiring electrode 55 of the substrate 54. Then, the conductive paste 56 is temporarily hardened. After this, while pressing the electronic component 51 on the substrate 54, heat is applied to connect the Au bumps 53 of the electronic component 51 and the wiring electrodes 55 of the substrate 54, which hardens the conductive adhesive (the conductive paste) 56 and the bonding resin 57 to mount the electronic component.

In the above-described method for mounting an electronic component, there are some problems:

(1) A material (a conductive paste) whose conductive component (filler) is formed of Ag or an alloy of Ag is typically used as the conductive adhesive, which leads to an increase in cost;

(2) although the bonding resin is used to enhance the bonding strength, since bonding only by applying small amounts of conductive adhesives at the top portions of the Au bumps is not strong enough, there is insufficient strength, and no moisture resistance; and (3) when the electronic component is mounted by pressing on the substrate and hardening the conductive adhesive (the conductive paste) and the bonding resin, since the Au bumps formed by using wire bonding have protruding configurations, the substrate, (which is typically formed of resin), flush against the lower side of the wiring electrode, is deformed. The deformation affects the connection reliability, and particularly, the moisture resistance.

SUMMARY OF THE INVENTION

Accordingly, the present invention is aimed at solving the above-described problems. It is an object of the present invention to provide a highly reliable method for mounting an electronic component and structure having mounted thereon an electronic component, in which the electronic component can be efficiently mounted on a substrate without expending significant cost.

To this end, according to one aspect of the present invention, there is provided a method for mounting an electronic component by connecting an electrode of the electronic component to a wiring electrode on the substrate via a bump, the method including the steps of:

disposing the top portion of an ultrasonic-wave applying unit (a collet) flush against the electronic component;

positioning the electronic component on the wiring electrode of the substrate, which is heated, via the bump, applying ultrasonic oscillation to the electronic component under a condition in which the oscillating amplitude of the top portion of the collet is larger than the oscillating amplitude of the electronic component, where the oscillating amplitude of the electronic component is 0.20 $\mu$m or larger, and metallically bonding the bump, and the electrode of the electronic component or the wiring electrode on the substrate, which are objects to be connected, so as to mount the electronic component on the substrate via the bump.

In this case, while disposing the top portion of the collet flush against the electronic component and positioning the electronic component on the wiring electrode of the substrate, which is heated, via the bump, the ultrasonic oscillation is applied to the electronic component under the condition in which the oscillating amplitude at the top portion of the collet is larger than the oscillating amplitude of the electronic component, where the oscillating amplitude of the electronic component is 0.20 $\mu$m or larger. As a result, without using an expensive conductive adhesive (a conductive paste), the bump, and the electrode of the electronic component or the wiring electrode on the substrate, which are objects to be connected, can be metallically bonded to reliably connect the bump and the electrode of the electronic component or the wiring electrode on the substrate.

In other words, with frictional heat caused by the ultrasonic oscillation, where the oscillating amplitude of the top portion of the collet is larger than the oscillating amplitude of the electronic component, and heat provided by heating, it is possible to produce a sufficient atomic diffusion between the bump and the electrode of the electronic component or the wiring electrode on the substrate. As a result, it is possible to obtain a sufficiently reliable connection, and moisture resistance, by metallically bonding the bump and the electrode of the electronic component or the wiring electrode on the substrate.

In addition, in the method for mounting an electronic component in accordance with the present invention, since the bump and the electrodes are metallically bonded while applying ultrasonic oscillation, it is possible to provide the heat energy necessary to perform metallic bonding at relatively low temperatures to avoid deforming the substrate. Accordingly, the deformation of a substrate, which occurs in a conventional mounting method, can be suppressed or prevented.

Furthermore, in the method for mounting an electronic component in accordance with another aspect of the invention, the bump is formed by plating and is made of a material including gold (Au) as a main component.

Although the present invention can also be applied in the cases of bumps formed by various methods and formed of various materials, when a plated bump flatly formed on a surface of an electrode is used, it is generally possible to suppress deformation of the substrate that occurs in the case of a bump with a protruding configuration. Thus, this is advantageous in improving characteristics such as moisture resistance. At the same time, the bonding strength can be improved since a large area for bonding can be provided. In addition, in the case of the bump plated by the material including gold (Au) as the main component, it is possible to metallically bond the bump to the electrode of the electronic component or the wiring electrode of the substrate by heating while applying the ultrasonic oscillation, with the result that the electrode of the electronic component can be reliably connected to the wiring electrode of the substrate via the bump.

Furthermore, in the method for mounting an electronic component in accordance with another aspect of the invention, the thickness of the substrate is 0.2 mm or less.

When the thickness of the substrate is increased, the substrate absorbs the ultrasonic oscillation. As a result sufficient frictional heat cannot be generated between the bump and the electrode of the electronic component or the wiring electrode of the substrate. However, when the thickness of the substrate is 0.2 mm or less, the substrate can be prevented from absorbing the ultrasonic oscillation so that sufficient frictional heat can be generated between the bump and the electrodes.

Furthermore, in the method for mounting an electronic component in accordance with another aspect of the invention, after connecting the electrode of the electronic component and the wiring electrode of the substrate via the bump, the overall electronic component is covered and sealed with a resin.

After connecting the electrode of the electronic component and the wiring electrode of the substrate via the bump, the electronic component itself and the overall electronic component are sealed by covering. With this arrangement, further improvement in weather resistance and moisture resistance can be achieved so as to enhance reliability.

Furthermore, in the method for mounting an electronic component in accordance with another aspect of the invention, after connecting the electrode of the electronic component and the wiring electrode of the substrate via the bump, a bonding resin for bonding the electronic component and the substrate fills a gap between the electronic component and the substrate. In addition, the overall electronic component is covered and sealed with a sealing resin.

When the bonding resin for bonding the electronic component and the substrate fills the gap between the electronic component and the substrate, and then the overall region including the electronic component and the part where the electronic component and the wiring electrode on the substrate are bonded is sealed by covering, both the bonding force due to the metallic bonding between the bump and the electrodes and the bonding force of the bonding resin further improve the reliability of the connection. This enhances moisture resistance and weather resistance, and significantly improves reliability.

In addition, according to the present invention, there is provided a structure having mounted thereon an electronic component, in which the electronic component is mounted by the method in accordance with the method discussed above. In this structure, an electrode of the electronic component is electrically and mechanically connected to a wiring electrode of a substrate by a bump, a bonding resin fills a gap between the electronic component and the substrate, and the overall electronic component is covered with a sealing resin.

Figure 1:
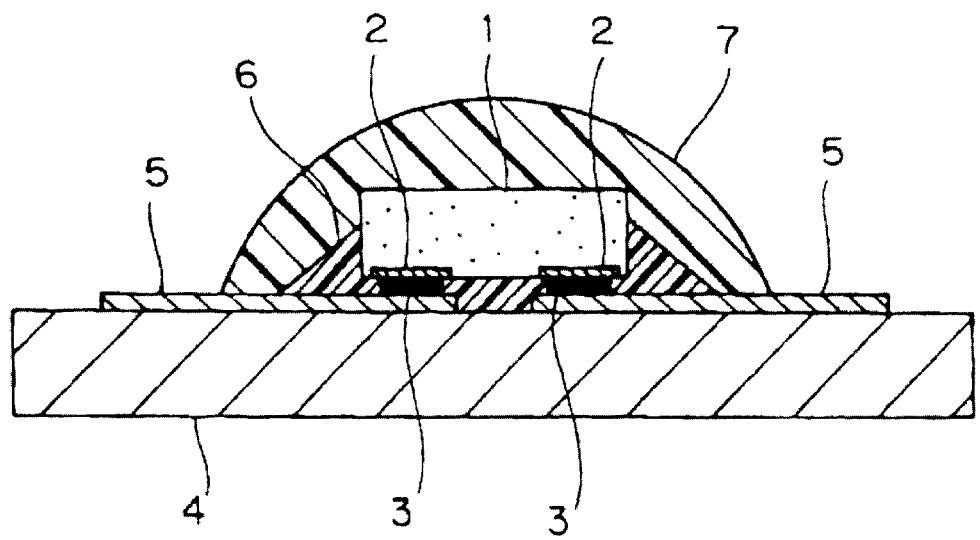
FIG. 1 is a sectional view illustrating a structure having a mounted electronic component according to an embodiment of the present invention.

| Reference Numerals |
| --- |
| 1 electronic component |
| 2 electrode |
| 3 bump |
| 4 substrate |
| 5 wiring electrode (substrate pad) |
| 6 coupling resin |
| 7 sealing resin |
| 8 collet |

DESCRIPTION OF THE EMBODIMENTS

A detailed description will be given of embodiments of the present invention.

FIG. 1 shows a sectional view illustrating a structure having a mounted electronic component, (for example, a field-effect transistor), in accordance with an embodiment of the present invention.

In the structure having a mounted electronic component used in the embodiment, an electronic component 1 is mounted on a substrate 4. The electronic component 1 is mounted on the substrate 4 by electrically and mechanically connecting electrodes 2 disposed on the lower surface of the electronic component 1 to wiring electrodes 5 (substrate pads) by bumps 3 formed of gold (Au). Electrodes 5 are disposed on substrate 4.

In addition, a bonding resin reliably fixes the electronic component 1 onto the substrate 4 by filling a gap between the electronic component 1 and the substrate 4. Furthermore, the electronic component 1, the bonding resin 6 extending from the gap between the electronic component 1 and the substrate 4, and the other parts, are entirely covered and sealed with a sealing resin 7.

In the structure having a mounted electronic component of this embodiment, the bumps 3 are formed on surfaces of the electrodes 2 of the electronic component 1 by an electrolytic plating method. The bumps 3 are bonded to the wiring electrodes 5 on the substrate 4 by a method for generating metallic bonding between the bumps 3 and the wiring electrodes 5 by heating while applying ultrasonic oscillation, (in other words), the method for mounting an electronic component in accordance with the present invention. With this structure, the electronic component 1 is electrically and mechanically connected to the substrate.

Furthermore, in the structure having a mounted electronic component of this embodiment, a resin substrate formed of BT (bismaleimide triazine) resin having a thickness of 0.2 mm or less is used as the substrate 4. In addition, each of the wiring electrodes 5 formed on the substrate 4 has a three-layer construction consisting of a copper layer, an Ni layer formed on the copper layer, and an Au layer formed on the Ni layer. The surface roughness of the wiring electrodes 5 is in the range of 0.10 $\mu$m to 0.50 $\mu$m as a centerline average roughness (RA).

Meanwhile, the bonding resin 6 is made of a resin material that contains a small ratio of inorganic filler with a low viscosity, and can easily fill the gap between the electronic component 1 and the substrate 4, (for example, the resin CV 5186S produced by Matsushita Electric Works, Ltd.). The sealing resin is made of a resin material that contains a large amount of inorganic filler with relatively high viscosity and has low moisture-absorbency and good moisture resistance, (for example, the resin CV 5181 produced by Matsushita Electric Works, Ltd.).

Next, a description will be given of a method for mounting the electronic component 1 to form the above structure.

Figure 2:
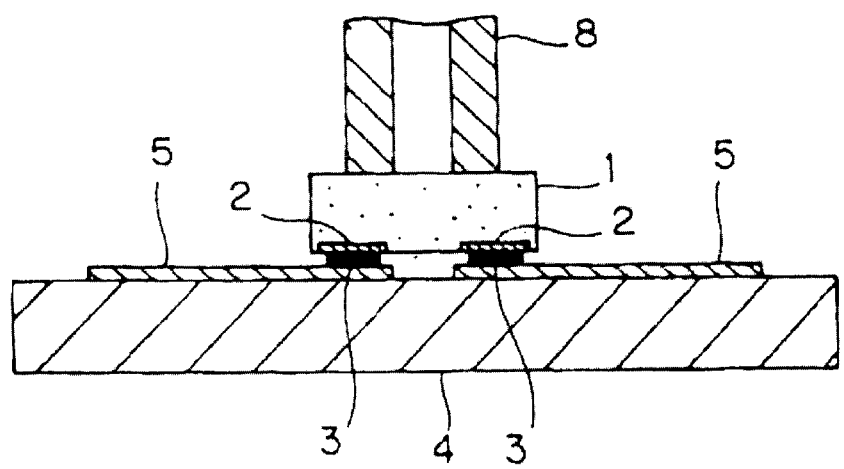
FIG. 2 is a sectional view illustrating a situation in which ultrasonic oscillation is applied to an electronic component in a step of a method for mounting an electronic component in accordance with an embodiment of the present invention.

(1) First, as shown in FIG. 2, the electronic component 1, on which the flat bumps 3 (Au bumps) are formed by electrolytic plating of gold (Au) on the electrodes 2, is fixed by adsorption of a collet 8. The wiring electrodes 5 are formed on a surface of the substrate 4 so as to mount the electronic component 1 on the substrate 4, which is heated.

(2) Then, a load is applied by the collet 8, by which the collet 8 is ultrasonically oscillated at approximately 60 kHz while pressing the bumps 3 onto the wiring electrodes 5 so as to metallically bond the bumps 3 and the wiring electrodes 5.

Figure 3:
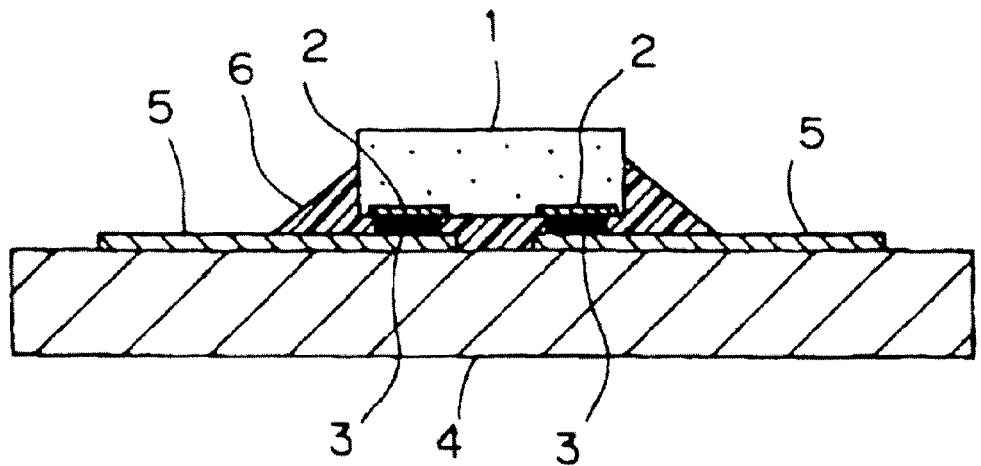
FIG. 3 is a sectional view illustrating a situation in which a bonding resin fills a gap between the electronic component and a substrate in a step of a method for mounting an electronic component in accordance with an embodiment of the present invention.
Figure 4:
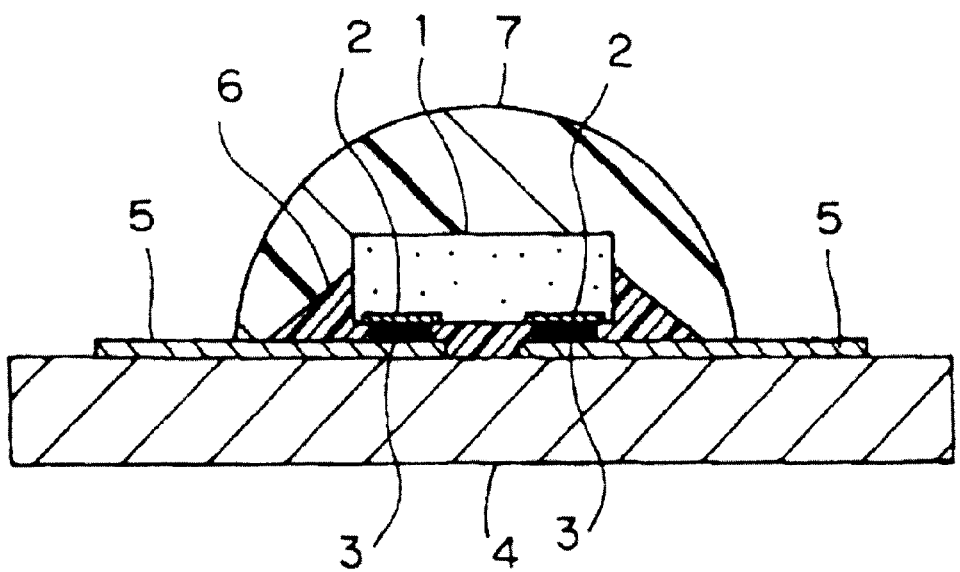
FIG. 4 is a section view illustrating a situation in which the overall electronic component is covered with a sealing resin in a step of a method for mounting an electronic component in accordance with an embodiment of the present invention.

(3) After this, the collet 8 is removed, and as shown in FIG. 3, the bonding resin 6 fills the gap between the electronic component 1 and the substrate 4. In addition, as shown in FIG. 4, the sealing resin 7 covers the overall region including the electronic component 1 and the part where the electronic component 1 and the wiring electrodes 5 of the substrate 4 are bonded. Heat is applied thereto to harden the bonding resin 6 and the sealing resin 7. With this arrangement, the structure having a mounted electronic component, as shown in FIG. 1, can be completed.

Table 1 shows the relationship between ultrasonic oscillation conditions and bonding strength when the electronic component 1 is mounted by the method for mounting an electronic component in accordance with the present invention. Regarding the bonding strength, the symbol x indicates that the bumps and the wiring electrodes are hardly bonded. The symbol Δ indicates that the bonding between the bumps and the wiring electrodes is not necessarily strong, although they are bonded. The symbol O indicates that the bumps and the wiring electrodes are bonded with sufficient bonding strength.

TABLE 1

| | OSCILLATION AMPLITUDE ($\mu$m) | | BONDING STRENGTH (gf/bump) |
|---|---|---|---|
| | ELECTRONIC COMPONENT | TOP PORTION OF COLLET | |
| TEST No. 1 | 0.16 | 0.28 | x (2.2) |
| TEST No. 2 | 0.18 | 0.40 | Δ (12.9) |
| TEST No. 3 | 0.20 | 0.42 | O (20.9) |
| TEST No. 4 | 0.26 | 0.45 | O (25.1) |
| TEST No. 5 | 0.34 | 0.49 | O (37.1) |
| TEST No. 6 | 0.36 | 0.96 | O (41.1) |

According to Table 1, when ultrasonic oscillation is generated by pressing the collet onto the upper surface of the electronic component, it is found that, although both the collet and the electronic component ultrasonically oscillate, sufficient bonding strength can be obtained, as shown in the columns of the test numbers 3, 4, and 5 of Table 1, when the oscillation amplitude of the top portion of the collet is larger than the oscillation amplitude of the electronic component, and the oscillation amplitude of the electronic component is 0.2 $\mu$m or larger.

When the electronic component is mounted by the method of the embodiment described above (an ultrasonic-bonding method), bonding strengths approximately five times greater than that of the conventional method (a conductive-adhesive bonding method), in which an electronic component is mounted on a substrate by a conductive adhesive via a bump, can be obtained.

Figure 5:
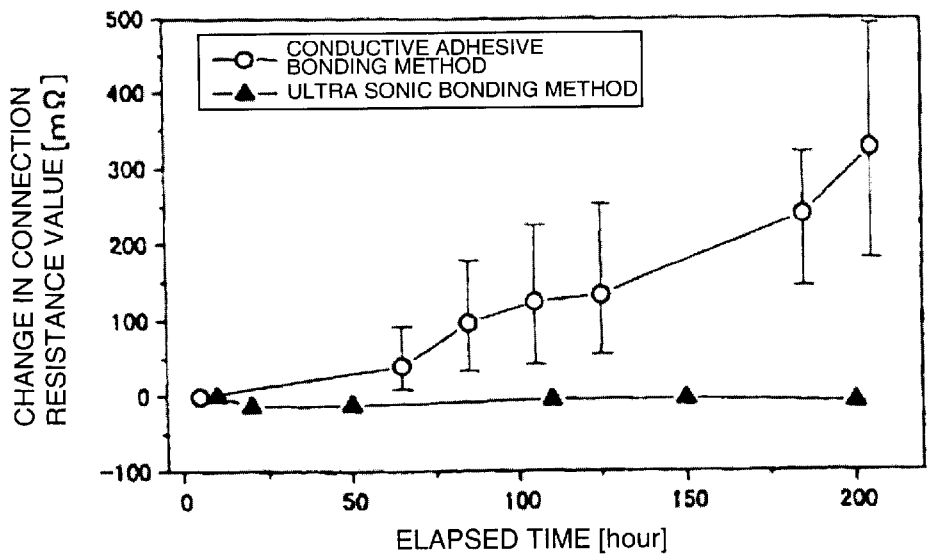
FIG. 5 is a graph showing the relationship between the time elapsed after mounting of an electronic component and values of connection resistance when the electronic component is mounted on a substrate by using the method in accordance with an embodiment of the present invention and when the electronic component is mounted on a substrate by using a conventional conductive-adhesive bonding method.

In addition, FIG. 5 is a view showing the relationship between time elapsed after mounting on the electronic component and values of connection resistance obtained when the electronic component is mounted on a substrate by the ultrasonic-bonding method in accordance with the present invention under certain conditions.

That is, the conditions for mounting the electronic component by the ultrasonic-bonding method are as follows:

Ultrasonic output: 0.7 W

Load: 0.5 N/bump

Oscillation amplitude: 0.25 $\mu$m (at the top portion of collet).

As shown in FIG. 5, when the electronic component is mounted by the conventional conductive-adhesive bonding method, as time passes after mounting of the electronic component, the values of connection resistance increase. In contrast, when the electronic component is mounted by the ultrasonic-bonding method in accordance with the present invention, even though time passes, the values of connection resistance do not increase. Accordingly, it is evident that the method of the present invention has good resistance to moisture and weather, with sufficient reliability.

Figure 6:
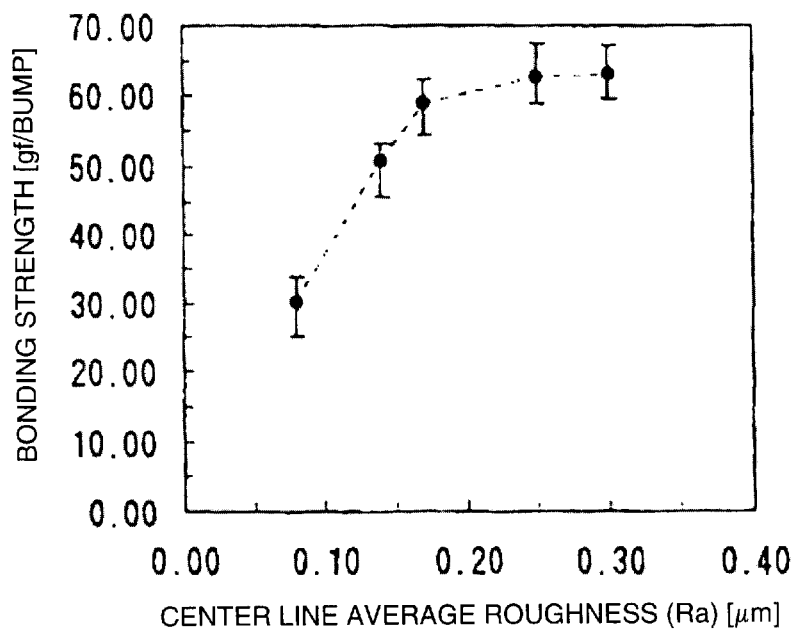
FIG. 6 is a graph showing the relationship between surface roughness (a centerline average roughness(RA)) of a wiring electrode on a substrate and bonding strength, when an electronic component is mounted on the substrate by using a method of an embodiment in accordance with the present invention.
Figure 7:
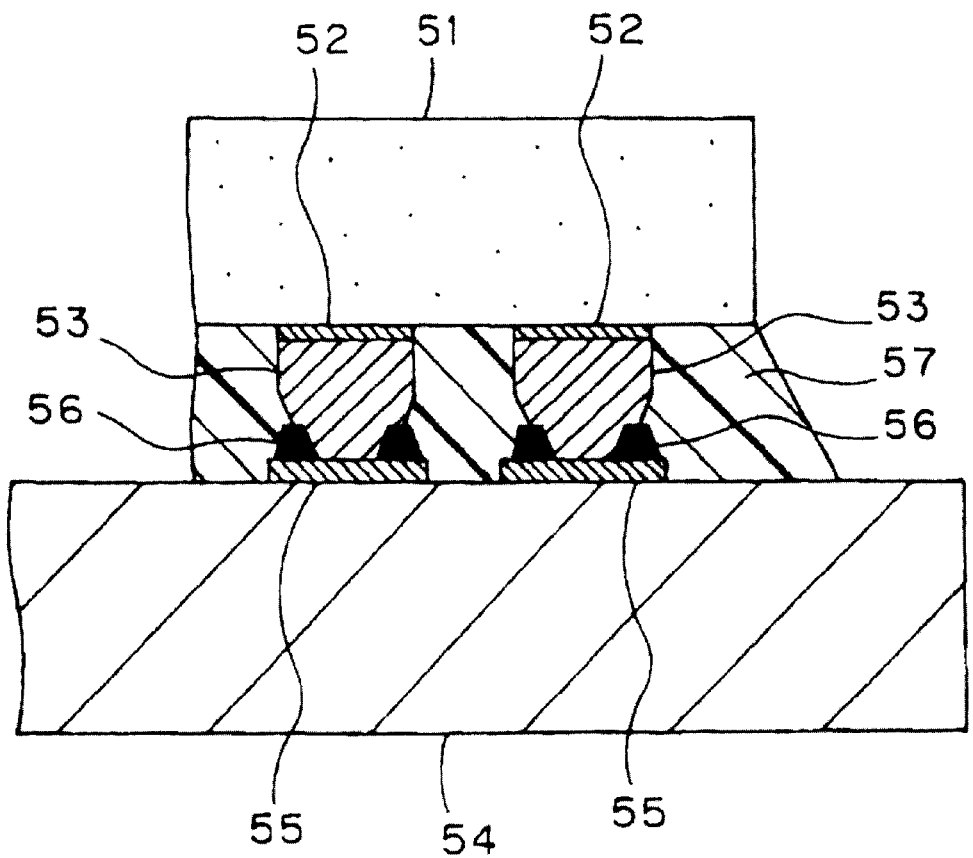
FIG. 7 is a view illustrating the conventional method for mounting an electronic component.

In addition, FIG. 6 is a view illustrating the relationship between the surface roughness (a centerline-average-roughness (RA)) of the wiring electrode of the substrate and bonding strength. As shown in FIG. 6, it is found that, on average, the bonding strength is stabilized and sufficient bonding reliability is obtained when the surface roughness (RA) of the wiring electrode of the substrate is 0.10 $\mu$m or larger. However, it is preferable to set the surface roughness (RA) of the wiring electrode in a specified range taking into account general mounting conditions. This is because the relationship between the surface roughness of the wiring electrode of the substrate and bonding strength are influenced by the amplitude of ultrasonic oscillation, temperature conditions, materials of the wiring electrode, and the like.

When the thickness of the substrate is increased, the ultrasonic oscillation applied to the electronic component is absorbed into the substrate 4 by deformation of the substrate. This makes it difficult to apply the necessary ultrasonic oscillation to metallically bond the bumps to the wiring electrodes of the substrate. However, when the thickness of the substrate is set to be 0.2 mm or less, it is found that the deformation of the substrate can be suppressed to properly provide ultrasonic oscillation, by which the bumps and the wiring electrodes on the substrate can be reliably metallically bonded.

However, depending on the conditions of ultrasonic oscillation (the relationship between frequency and oscillation amplitude), it is possible that, even when the thickness of the substrate is set to be 0.2 mm or more, sufficient metallic bonding can be obtained. Therefore, in the present invention, the thickness of the substrate is not necessarily limited to 0.2 mm or less.

In the above embodiment, there is illustrated the case in which the bumps are flat types of bumps formed by electrolytic plating of gold. However, there is no special restriction in terms of the method for forming the bumps, and various known methods can be used to form the bumps.

In addition, the present invention can also be applied to a case in which bumps having protruding configurations (wire bumps) are formed on electrodes of an electronic component by wire bonding, and the wire bumps are bonded to wiring electrodes on a substrate so as to mount the electronic component.

Furthermore, materials other than gold (Au) or an alloy including gold (Au) as a main component can be used for forming the bumps. It is possible to use various materials that can generate metallic bonding between the bumps and each of the electrodes of the electronic component and the wiring electrodes of the substrate by applying ultrasonic oscillation and heat.

Furthermore, the present invention is not restricted to the above-described embodiment in which the bumps are disposed on the electronic component. Such an embodiment is shown as an example for illustration purposes only. The present invention can also be applied to a case in which bumps are formed on wiring electrodes of a substrate and electrodes of the electronic component are metallically bonded to the bumps formed on the wiring electrodes so as to mount the electronic component. In this case, similar advantages can be obtained as in the case of the above embodiment.

Furthermore, the present invention is not restricted to the above embodiment in other respects. Various applications and modifications can be applied within the scope and the spirit of the present invention regarding the kind of an electronic component, materials for forming electrodes of the electronic component and wiring electrodes on a substrate, the manner of disposing these electrodes, conditions for applying ultrasonic oscillation, conditions for heating, the level of the strength of pressure given when the electronic component is pressed onto the substrate, and the like.

As described above, in the method for mounting an electronic component in accordance with the present invention, while disposing the top portion of a collet flush against the electronic component and positioning the electronic component on wiring electrodes of a substrate, which is heated, via bumps, ultrasonic oscillation is applied to the electronic component where the oscillation amplitude at the top portion of the collet is larger than the oscillation amplitude of the electronic component, which may be 0.20 μm or more. With this arrangement, the bumps and the electrodes of the electronic component or the wiring electrodes of the substrate, which are objects to be connected, are metallically bonded. In this situation, without using an expensive conductive adhesive (a conductive paste), the bumps and the electrodes of the electronic component or the wiring electrodes of the substrate can be reliably metallically connected.

In other words, with frictional heat generated by the ultrasonic oscillation produced where the oscillation amplitude at the top portion of the collet is larger than the oscillation amplitude of the electronic component, and the oscillating amplitude at the top portion of the collet is 0.20 μm or more, and heat provided by heating, it is possible to produce a significant atomic diffusion between the bumps and the electrodes of the electronic component, or between the bumps and the wiring electrodes on the substrate. As a result, the bumps and the electrodes of the electronic component, or the bumps and the wiring electrodes on the substrate are metallically bonded so as to obtain sufficient connection reliability and moisture resistance.

In addition, in the method for mounting an electronic component in accordance with the present invention, since the bumps and the respective electrodes are metallically bonded while applying ultrasonic oscillation, it is possible to give heat energy necessary to generate metallic bonding at relatively low temperatures which does not cause deformation of the substrate. Thus, deformation of a substrate occurring in the case of the conventional method for mounting an electronic component can be suppressed or prevented.

In addition, the present invention can also be applied to cases in which the bumps are formed of various materials. As described in claim 2, when the bumps are bumps plated with gold (Au) as a main component, deformation of a substrate, which occurs in the case of the bumps having protruding configurations formed by using the wire bonding technology, can be suppressed so as to enhance characteristics such as moisture resistance. Furthermore, since it is possible to efficiently perform metallic bonding of the electrodes of the electronic component to the wiring electrodes of the substrate via the bumps by heating while applying ultrasonic oscillation, the present invention can more work effectively.

In addition, when the thickness of the substrate is increased, the substrate absorbs the ultrasonic oscillation, by which sufficient frictional heat cannot be generated between the bumps and the electrodes of the electronic component or between the bumps and the wiring electrodes of the substrate. However, when the thickness of the substrate is set to be 0.2 mm or less, this arrangement prevents the substrate from absorbing the ultrasonic oscillation so that sufficient frictional heat can be generated between the bumps and the respective electrodes.

In addition, according to the method for mounting an electronic component described herein, after connecting the electrodes of the substrate via the bumps, the overall electronic component is sealed by covering. With this arrangement, further improvement in weather resistance and moisture resistance can be achieved so as to enhance reliability.

In addition, according to the method for mounting an electronic component described herein, when a bonding resin for bonding the electronic component and the substrate fills the gap between the electronic component and the substrate, and then the overall region including the electronic component and the part where the wiring electrodes on the substrate are bonded to the electronic component is sealed by covering with a sealing resin, both the bonding force due to the metallic bonding between the bumps and the respective electrodes and the bonding force of the bonding resin further improve bonding reliability. This enhances moisture resistance and light resistance with the result that reliability can be significantly improved.

In addition, the structure having a mounted electronic component in accordance with the present invention is applied in the case where the electronic component is mounted by the above-described method. With this structure, characteristics such as moisture resistance can be improved so as to achieve high reliability in mounting an electronic component.

What is claimed is:

1. A method for mounting an electronic component by connecting an electrode of the electronic component to a wiring electrode of a substrate via a bump so as to mount the electronic component on the substrate, comprising the steps of:

disposing a contact portion of an ultrasonic-wave applying member in contact with the electronic component;

positioning the electronic component on the wiring electrode of the substrate via the bump;

applying ultrasonic oscillation to the electronic component under a condition in which the oscillating amplitude of the contact portion of the ultrasonic-wave applying member is larger than the oscillating amplitude of the electronic component, and the oscillating amplitude of the electronic component is 0.20 $\mu$m or larger so as to metallically bond the bump and the electrode of the electronic component or the bump and the wiring electrode on the substrate to thereby mount the electronic component on the substrate via the bump.

2. A method for mounting an electronic component according to claim 1, wherein the bump is a plated bump made of a material including gold (Au) as a main component.

3. A method for mounting an electronic component according to claim 2, wherein a thickness of the substrate is 0.2 mm or less.

4. A method for mounting an electronic component according to claim 3, wherein the entire electronic component is sealed by covering with a resin after the electrode of the electronic component and the wiring electrode of the substrate are connected via the bump.

5. A method for mounting an electronic component according to claim 2, wherein the entire electronic component is sealed with a resin after the electrode of the electronic component and the wiring electrode of the substrate are connected via the bump.

6. A method for mounting an electronic component according to claim 1, wherein a thickness of the substrate is 0.2 mm or less.

7. A method for mounting an electronic component according to claim 6, wherein the entire electronic component is sealed with a resin after the electrode of the electronic component and the wiring electrode of the substrate are connected via the bump.

8. A method for mounting an electronic component according to claim 1, wherein the entire electronic component is sealed with a resin after the electrode of the electronic component and the wiring electrode of the substrate are connected via the bump.

9. A method for mounting an electronic component according to claim 1, wherein after the electrode of the electronic component and the wiring electrode of the substrate are connected via the bump, a bonding resin for bonding the electronic component and the substrate is filled in a gap between the electronic component and the substrate, and the entire electronic component is sealed by a sealing resin.

10. A method for mounting an electronic component by connecting an electrode of the electronic component to a wiring electrode of a substrate via a bump so as to mount the electronic component on the substrate, comprising the steps of:

disposing a contact portion of an ultrasonic-wave applying member in contact with the electronic component;

positioning the electronic component on the wiring electrode of the substrate via the bump;

applying ultrasonic oscillation to the electronic component under a condition in which the oscillating amplitude of the contact portion of the ultrasonic-wave applying member is larger than the oscillating amplitude of the electronic component, so as to metallically bond the bump and the electrode of the electronic component or the bump and the wiring electrode on the substrate to thereby mount the electronic component on the substrate via the bump.

11. A method for mounting an electronic component according to claim 10, wherein the entire electronic component is sealed with a resin after the electrode of the electronic component and the wiring electrode of the substrate are connected via the bump.

12. A method for mounting an electronic component according to claim 10, wherein the bump is a flat plated bump.

13. A method for mounting an electronic component according to claim 12, wherein said bump is made of a material including gold (Au) as a main component.

14. A method for mounting an electronic component according to claim 12, wherein the entire electronic component is sealed with a resin after the electrode of the electronic component and the wiring electrode of the substrate are connected via the bump.

15. A method for mounting an electronic component according to claim 12, wherein the thickness of the substrate is 0.2 mm or less.

16. A method for mounting an electronic component according to claim 15, wherein the entire electronic component is sealed by covering with a resin after the electrode of the electronic component and the wiring electrode of the substrate are connected via the bump.

17. A method for mounting an electronic component according to claim 10, wherein a thickness of the substrate is 0.2 mm or less.

18. A method for mounting an electronic component according to claim 17, wherein the entire electronic component is sealed with a resin after the electrode of the electronic component and the wiring electrode of the substrate are connected via the bump.

19. A method for mounting an electronic component according to claim 10, wherein after the electrode of the electronic component and the wiring electrode of the substrate are connected via the bump, a bonding resin for bonding the electronic component and the substrate is filled in a gap between the electronic component and the substrate, and the entire electronic component is sealed by a sealing resin.

20. A method for mounting an electronic component according to claim 10, further comprising the step of heating said substrate during said bonding step.

21. A method for mounting an electronic component according to claim 20, wherein the entire electronic component is sealed with a resin after the electrode of the electronic component and the wiring electrode of the substrate are connected via the bump.

22. A method for mounting an electronic component according to claim 20, wherein the bump is a flat plated bump.

23. A method for mounting an electronic component according to claim 20, wherein a thickness of the substrate is 0.2 mm or less.

24. A method for mounting an electronic component according to claim 20, wherein after the electrode of the electronic component and the wiring electrode of the substrate are connected via the bump, a bonding resin for bonding the electronic component and the substrate is filled in a gap between the electronic component and the substrate, and the entire electronic component is sealed by a sealing resin.

* * * * *